United States Patent [19]

Ma et al.

[11] Patent Number: 5,418,502
[45] Date of Patent: May 23, 1995

[54] MICRO POWER R-C RELAXATION OSCILLATOR

[75] Inventors: Bing F. Ma; W. Richard Davis, both of Sunnyvale, Calif.

[73] Assignee: Micro Linear Corporation, San Jose, Calif.

[21] Appl. No.: 205,621

[22] Filed: Mar. 3, 1994

[51] Int. Cl.6 .................. H03K 3/023; H03K 3/282
[52] U.S. Cl. .................................... 331/111; 331/143
[58] Field of Search ................................. 331/111, 143

[56] References Cited

U.S. PATENT DOCUMENTS 4,407,588  10/1983  Arichi et al. ............. 331/111 X
4,931,750   6/1990  Gontowski ............... 331/111
4,983,931   1/1991  Nakano .................... 331/143 X Primary Examiner—Siegfried H. Grimm
Attorney, Agent, or Firm—Haverstock, Medlen & Carroll

[57] ABSTRACT

An R-C relaxation oscillator having two comparators and a silicon controlled rectifier dissipates very low average power without resulting in frequency instabilities due to circuit propagation delays. A timing capacitor $C_T$ is charged through a timing resistor $R_T$. The first comparator compares the voltage across the timing capacitor with an upper threshold voltage $V_{TH}$. When the voltage across the timing capacitor crosses the upper threshold voltage, the comparator turns on the silicon controlled rectifier, which causes the capacitor to discharge the voltage that it has stored. The second comparator turns off the silicon controlled rectifier when the voltage across the timing capacitor falls below a lower threshold voltage $V_{TL}$. The silicon controlled rectifier also provides boosted comparator bias current during the discharge phase, enabling the second comparator to respond quickly to the lower threshold voltage crossing and allowing fast capacitor discharge (therefore narrow clock pulses) and increasing frequency stability.

18 Claims, 6 Drawing Sheets

MICRO POWER R-C RELAXATION OSCILLATOR

FIELD OF THE INVENTION

This invention relates to the field of relaxation oscillators. More particularly, this invention relates to the field of R-C relaxation oscillators.

BACKGROUND OF THE INVENTION

The block diagram of a basic dual-comparator R-C relaxation oscillator is shown in FIG. 1. The circuit consists of three functional sub-blocks: (i) the comparators $X_1$ and $X_2$ for detecting the threshold voltages $V_{TH}$ and $V_{TL}$, set by the resistive divider network including the resistors $R_A$, $R_B$ and $R_C$; (ii) the timing components including the resistor $R_T$, the capacitor $C_T$ and the resistor $R_D$; and (iii) an R-S latch $X_3$ for controlling the discharge of the capacitor $C_T$ through the npn transistor $Q_D$ and the resistor $R_D$.

Assuming that the output Q of the R-S latch $X_3$ is at a logical low and the transistor $Q_D$ is turned off initially, the resistor $R_T$ will charge the capacitor $C_T$ towards the upper threshold voltage $V_{TH}$. The upper threshold voltage $V_{TH}$ is set by the resistive divider as $$V_{TH} = \frac{V_{CC}(R_B + R_C)}{R_A + R_B + R_C} \quad (1)$$

The output of the comparator $X_1$ rises from a logical low to a logical high when the voltage across the capacitor $C_T$ crosses the upper threshold voltage $V_{TH}$ and the positive input of the comparator $X_1$ becomes greater than its negative input. Once the output of the comparator $X_1$ switches to a logical high, the input S of the R-S latch $X_3$ will also be raised to a logical high and the output Q of the R-S latch $X_3$ will rise from a logical low to a logical high. The transistor $Q_D$ will then turn on and saturate. If the value of the resistor $R_D$ is properly chosen, the transistor $Q_D$ and the resistor $R_D$ will discharge the voltage across the capacitor $C_T$ towards the lower threshold voltage $V_{TL}$ set again by the resistive divider network as $$V_{TL} = \frac{V_{CC}(R_C)}{R_A + R_B + R_C} \quad (2)$$

As the voltage across the capacitor $C_T$ is discharged below the upper threshold voltage $V_{TH}$ and the positive input of the comparator $X_1$ becomes less than the negative input, the output of the comparator $X_1$ will drop from a logical high to a logical low. When the voltage across the timing capacitor $C_T$ falls below the lower threshold voltage $V_{TL}$ so that the negative input of the comparator $X_2$ is less than the positive input, the output of the comparator $X_2$ will rise to a logical high and the R-S latch $X_3$ will reset. When the R-S latch $X_3$ is reset the output Q of the R-S latch will drop to a logical low turning the transistor $Q_D$ off and ending the discharge cycle. The resistor $R_T$ will then charge the timing capacitor $C_T$ and the cycle will repeat. The timing diagram of the oscillator of FIG. 1 is shown in FIG. 2. It can be shown that the charging time $T_C$ and the discharging time $T_D$ of the timing capacitor $C_T$ are equal to $$T_C = R_T C_T \ln\left(1 + \frac{R_B}{R_A}\right) \quad (3)$$

and $$T_D = (R_T \| R_D) C_T \ln\left[\frac{\frac{V_{CC}(R_B + R_C)}{R_A + R_B + R_C} - \frac{R_D V_{CC} + R_T V_{CE(SAT)}}{R_T + R_D}}{\frac{V_{CC}(R_C)}{R_A + R_B + R_C} - \frac{R_D V_{CC} + R_T V_{CE(SAT)}}{R_T + R_D}}\right] \quad (4)$$

respectively.

Equations (3) and (4) represent the ideal charging and discharging times of the timing capacitor $C_T$ in the absence of a propagation delay time. The effect of circuit propagation delays on the oscillator waveform is illustrated in FIG. 2. The time taken to turn on the transistor $Q_D$ and discharge the capacitor $C_T$ from the instant that the voltage across the capacitor $C_T$ rises above the upper threshold voltage $V_{TH}$ is represented by the time period $t_{pd1}$. Likewise the time period $t_{pd2}$ represents the propagation delay time for the comparator $X_2$ and the R-S latch $X_3$ to turn off the transistor $Q_D$ from the time that the voltage of the capacitor $C_T$ crosses the lower threshold voltage $V_{TL}$. The propagation time delays $t_{pd1}$ and $t_{pd2}$ will cause the oscillator period to deviate from its ideal value of the charging time period $T_C$ plus the discharging time period $T_D$. Good oscillator frequency stability requires that the time periods $t_{pd1}$ and $t_{pd2}$ be kept to a small fraction of the total time period. Usually the comparators $X_1$ and $X_2$ and the R-S latch $X_3$ are designed for fast responses and are biased with sufficient quiescent current to shorten the propagation delay time.

If the value of the resistor $R_D$ is chosen to be much lower than the value of the resistor $R_T$, the discharging time period $T_D$ will be much shorter than the charging time period $T_C$. Due to the higher rate of change in the timing capacitor $C_T$ voltage during discharge, the propagation delay time $t_{pd2}$ of the comparator $X_2$ causes a larger capacitor $C_T$ voltage undershoot $V_{US}$ than the capacitor $C_T$ voltage overshoot $V_{OS}$ (FIG. 2). The voltage undershoot can be defined as the difference between the voltage at the point that the capacitor $C_T$ begins charging and the lower threshold voltage $V_{TL}$. Correspondingly, the voltage overshoot can be defined as the difference between the voltage at the point that the capacitor $C_T$ begins discharging and the upper threshold voltage $V_{TH}$. The time $t_{RCV2}$ taken for the capacitor $C_T$ voltage to recover from its undershoot is much longer than the propagation delay time $t_{pd2}$ for the comparator $X_2$ because the capacitor $C_T$ charging rate is much lower than its discharging rate. It can also be seen from FIG. 2 that the overshoot recovery time period $t_{RCV1}$ is less than the propagation delay time periods $t_{pd1}$ and $t_{pd2}$, which are much less than the undershoot recovery time period $t_{RCV2}$. Since the propagation delay time $t_{pd2}$ of the comparator $X_2$ varies with temperature and the integrated circuit fabrication process, the undershoot recovery time period $t_{RCV2}$ causes by far the highest frequency instability in the type of relaxation oscillator shown in FIG. 1. In micro power circuit design, comparator quiescent current is usually kept low. However, this approach has the consequence of prolonging the propagation delay time periods $t_{pd1}$ and $t_{pd2}$.

What is needed is a relaxation oscillator which minimizes the undershoot recovery time period $t_{RCV2}$ and therefore also minimizes the frequency instability of the circuit. What is also needed is a relaxation oscillator which minimizes the propagation delay times and consumes low power.

SUMMARY OF THE INVENTION

An R-C relaxation oscillator having two comparators and an R-S latch dissipates very low average power without resulting in frequency instabilities due to circuit propagation delays. The timing capacitor $C_T$ is charged through a timing resistor $R_T$. The first comparator compares the voltage across the timing capacitor with the upper threshold voltage $V_{TH}$. When the voltage across the timing capacitor crosses the upper threshold voltage, the comparator turns on a silicon controlled rectifier, which causes the capacitor to discharge the voltage that it has stored. The second comparator turns off the silicon controlled rectifier when the voltage across the timing capacitor falls below the lower threshold voltage $V_{TL}$. The silicon controlled rectifier also provides boosted comparator bias current during the discharge phase, enabling the second comparator to respond quickly to the lower threshold voltage crossing and allowing fast capacitor discharge (therefore narrow clock pulses) and increasing frequency stability.

DETAILED DESCRIPTION OF THE INVENTION

Figure 3:
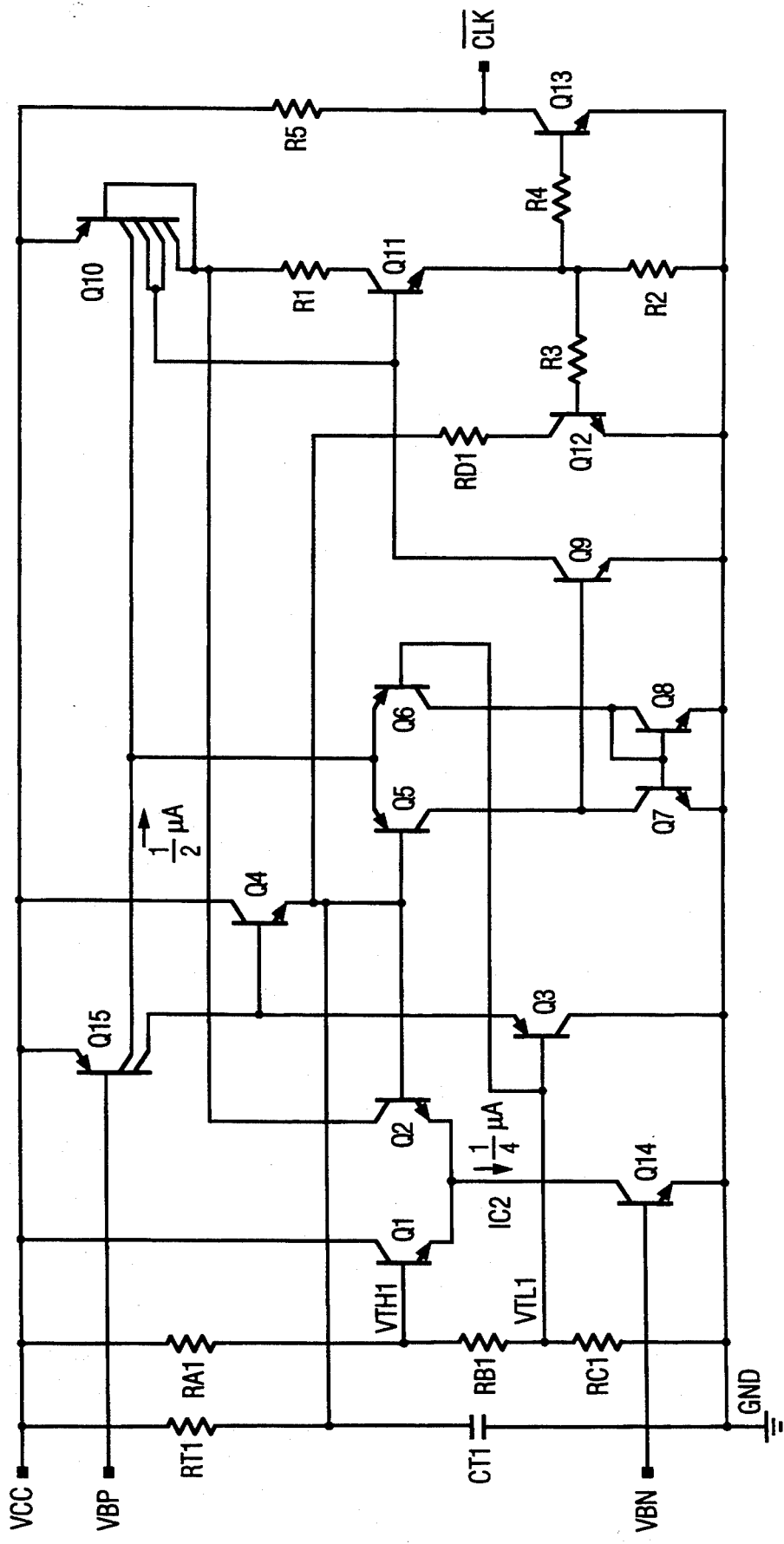
FIG. 3 illustrates a micro power relaxation oscillator of the present invention.

The micro power oscillator of the present invention is shown in FIG. 3. The schematic of the relaxation oscillator of the present invention is illustrated in FIG. 3. The resistor $R_{T1}$ has a first and a second terminal. The first terminal of the resistor $R_{T1}$ is coupled to the power supply $V_{CC}$. The capacitor $C_{T1}$ has a first and a second terminal. The second terminal of the resistor $R_{T1}$ is coupled to the first terminal of the capacitor $C_{T1}$ and the second terminal of the capacitor $C_{T1}$ is coupled to the ground. The resistor $R_{A1}$ has a first and a second terminal. The first terminal of the resistor $R_{A1}$ is coupled to the power supply $V_{CC}$. The resistor $R_{B1}$ has a first and a second terminal. The second terminal of the resistor $R_{A1}$ is coupled to the first terminal of the resistor $R_{B1}$ forming the node $V_{TH1}$ where the upper threshold voltage is measured from. The resistor $R_{C1}$ has a first and a second terminal. The second terminal of the resistor $R_{B1}$ is coupled to the first terminal of the resistor $R_{C1}$ forming the node $V_{TL1}$ where the lower threshold voltage is measured from. The second terminal of the resistor $R_{C1}$ is coupled to the ground.

The transistors $Q_1$ and $Q_2$ form a first differential pair which is biased by the current source transistor $Q_{14}$. The npn transistor $Q_1$ has a base, a collector and an emitter. The base of the transistor $Q_1$ is coupled to the node $V_{TH1}$ and the collector of the transistor $Q_1$ is coupled to the power supply $V_{CC}$. The npn transistor $Q_2$ has a base, a collector and an emitter and the npn transistor $Q_{14}$ has a base, a collector and an emitter. The emitter of the transistor $Q_1$ is coupled to the emitter of the transistor $Q_2$ and the collector of the transistor $Q_{14}$. The base of the transistor $Q_{14}$ is coupled to the biasing voltage $V_{BN}$ and the emitter of the transistor $Q_{14}$ is coupled to the ground.

The transistors $Q_5$ and $Q_6$ form a second differential pair. The pnp transistor $Q_5$ has a base, a collector and an emitter and the pnp transistor $Q_6$ has a base, a collector and an emitter. The base of the transistor $Q_5$ is coupled to the base of the transistor $Q_2$, the second terminal of the resistor $R_T$ and the first terminal of the capacitor $C_{T1}$. The pnp transistor $Q_3$ has a base, a collector and an emitter and the npn transistor $Q_4$ has a base, a collector and an emitter. The base of the transistor $Q_6$ is coupled to the base of the transistor $Q_3$ and to the lower threshold voltage node $V_{TL1}$. The collector of the transistor $Q_3$ is coupled to the ground. The transistor $Q_{15}$ has a base, an emitter, a first collector and a second collector. The base of the transistor $Q_{15}$ is coupled to the biasing voltage $V_{BP}$ and the emitter of the transistor $Q_{15}$ is coupled to the power supply $V_{CC}$. The second collector of the transistor $Q_{15}$ is coupled to the base of the transistor $Q_4$ and the emitter of the transistor $Q_3$. The collector of the transistor $Q_4$ is coupled to the power supply $V_{CC}$ and the emitter of the transistor $Q_4$ is coupled to the base of the transistor $Q_5$, the second terminal of the resistor $R_{T1}$ and the first terminal of the capacitor $C_{T1}$. The first collector of the transistor $Q_{15}$ is coupled to the emitter of the transistor $Q_5$ and the emitter of the transistor $Q_6$.

The npn transistor $Q_7$ has a base, a collector and an emitter and the npn transistor $Q_8$ has a base, a collector and an emitter. The collector of the transistor $Q_7$ is coupled to the collector of the transistor $Q_5$ and the emitter of the transistor $Q_7$ is coupled to the ground. The collector of the transistor $Q_8$ is coupled to the collector of the transistor $Q_6$ and the emitter of the transistor $Q_8$ is coupled to the ground. The base of the transistor $Q_7$ is coupled to the base of the transistor $Q_8$ and the collector of the transistor $Q_6$. The transistor $Q_9$ has a base, a collector, and an emitter. The base of the transistor $Q_9$ is coupled to the collector of the transistor $Q_5$ and the collector of the transistor $Q_7$ and the emitter of the transistor $Q_9$ is coupled to the ground.

The transistor $Q_{10}$ has a base, an emitter, a first collector, a second collector, a third collector and a fourth collector. The emitter of the transistor $Q_{10}$ is coupled to the power supply $V_{CC}$. The base of the transistor $Q_{10}$ is coupled to the fourth collector of the transistor $Q_{10}$ and the collector of the transistor $Q_2$. The first collector of the transistor $Q_{10}$ is coupled to the first collector of the transistor $Q_{15}$, the emitter of the transistor $Q_5$ and the emitter of the transistor $Q_6$. The second collector of the transistor $Q_{10}$ is coupled to the third collector of the transistor $Q_{10}$ and to the collector of the transistor $Q_9$.

The resistor $R_{D1}$ has a first terminal and a second terminal. The first terminal of the resistor $R_{D1}$ is coupled to the emitter of the transistor $Q_4$, the second terminal of the resistor $R_{T1}$, the first terminal of the capacitor $C_{T1}$, the base of the transistor $Q_2$ and the base of the transistor $Q_5$. The transistor $Q_{12}$ has a base, a collector and an emitter. The collector of the transistor $Q_{12}$ is coupled to the second terminal of the resistor $R_{D1}$ and the emitter of the transistor $Q_{12}$ is coupled to the ground.

The resistor $R_1$ has a first terminal and a second terminal. The first terminal of the resistor $R_1$ is coupled to the base and the fourth collector of the transistor $Q_{10}$ and to the collector of the transistor $Q_2$. The transistor $Q_{11}$ has a base, a collector and an emitter. The base of the transistor $Q_{11}$ is coupled to the collector of the transistor $Q_9$ and to the second and third collectors of the transistor $Q_{10}$. The collector of the transistor $Q_{11}$ is coupled to the second terminal of the resistor $R_1$.

The resistor $R_2$ has a first terminal and a second terminal, the resistor $R_3$ has a first terminal and a second terminal and the resistor $R_4$ has a first terminal and a second terminal. The emitter of the transistor $Q_{11}$ is coupled to the first terminal of the resistor $R_2$, the second terminal of the resistor $R_3$ and the first terminal of the resistor $R_4$. The first terminal of the resistor $R_3$ is coupled to the base of the transistor $Q_{12}$ and the second terminal of the resistor $R_2$ is coupled to the ground.

Figure 1:
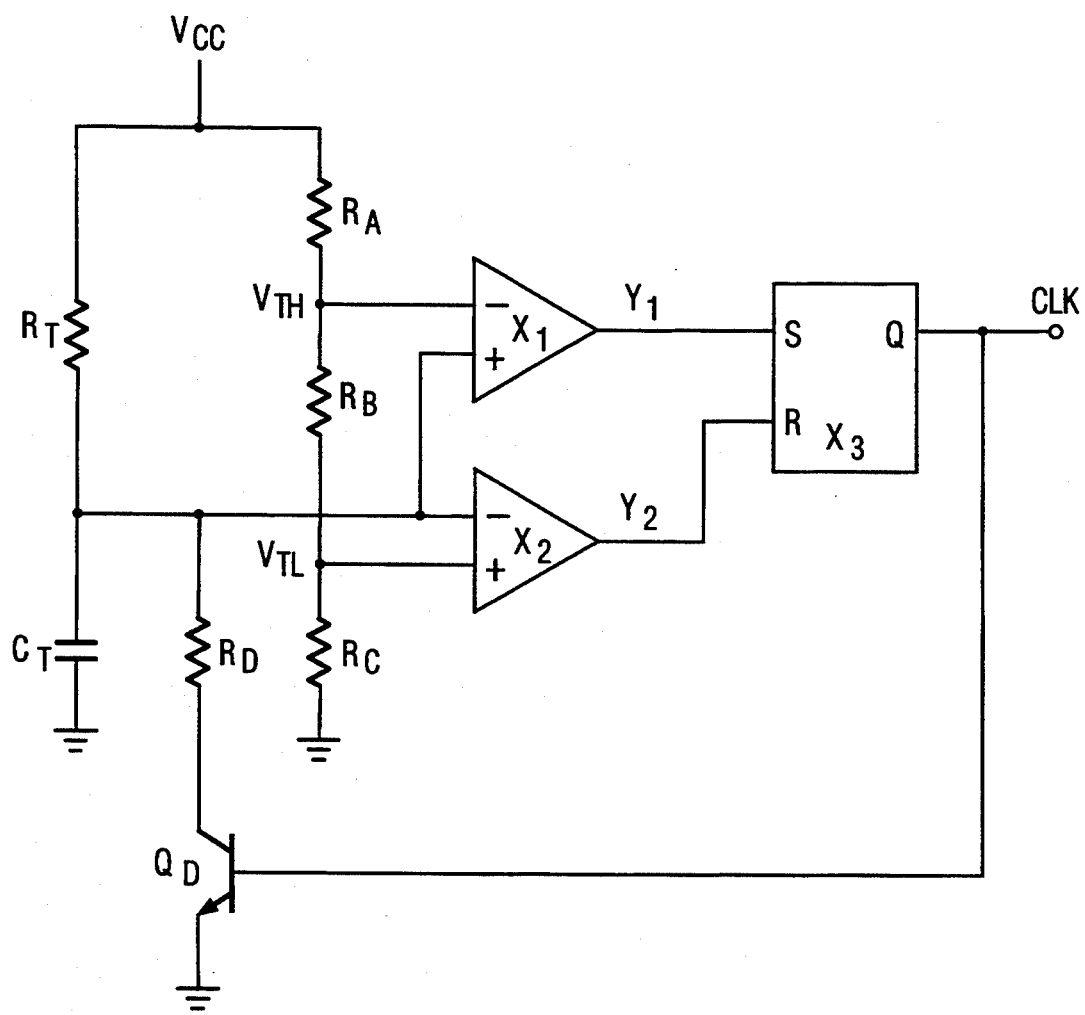
FIG. 1 illustrates a schematic of a basic dual-comparator R-C relaxation oscillator of the prior art.

The resistor $R_5$ has a first terminal and a second terminal. The first terminal of the resistor $R_5$ is coupled to the power supply $V_{CC}$. The transistor $Q_{13}$ has a base, a collector and an emitter. The base of the transistor $Q_{13}$ is coupled to the second terminal of the resistor $R_4$, the collector of the transistor $Q_{13}$ is coupled to the second terminal of the resistor $R_5$ and the emitter of the transistor is coupled to the ground. The logic signal output $\overline{clk}$ is taken from the junction of the second terminal of the resistor $R_5$ and the collector of the transistor $Q_{13}$. The oscillator upper and lower voltage thresholds $V_{TL}$ and $V_{TH}$ are set up by the resistive divider network which includes the resistors $R_{A1}$, $R_{B1}$ and $R_{C1}$. The timing components include the resistor $R_{T1}$, the capacitor $C_{T1}$ and the resistor $R_{D1}$. The current source transistor $Q_{14}$ biases the differential pair including the transistors $Q_1$ and $Q_2$. The base terminal of the transistor $Q_1$ is coupled to the upper threshold voltage $V_{TH1}$ of the resistive divider network and the base of the transistor $Q_2$ is coupled to the capacitor $C_{T1}$. The transistors $Q_1$ and $Q_2$ function as the upper threshold crossing comparator ($X_1$ in FIG. 1). Similarly, the pnp current source transistor $Q_{15}$ biases the pnp input stage including the transistors $Q_5$ and $Q_6$ of the lower threshold crossing comparator ($X_2$ in FIG. 1). The transistors $Q_7$ and $Q_8$ convert the differential output currents from the transistors $Q_5$ and $Q_6$ into a single-ended voltage at the base of the transistor $Q_9$. The comparator output is taken at the collector of the transistor $Q_9$. A silicon controlled rectifier (SCR) includes the transistors $Q_{10}$, $Q_{11}$, and the resistor $R_1$. The silicon controlled rectifier is used as the R-S latch ($X_3$ in FIG. 1). The output Q of the latch is taken at the emitter of the transistor $Q_{11}$. The transistor $Q_{12}$ discharges the capacitor $C_{T1}$ through the resistor $R_{D1}$. The resistor $R_4$ and the transistor $Q_{13}$ convert the logic signal at the emitter of the transistor $Q_{11}$ into a CMOS-compatible logic signal at the collector of the transistor $Q_{13}$. The resistor $R_6$ is used as the load for the transistor $Q_{13}$. The pnp transistor $Q_3$ functions as a level-shifter with its emitter current supplied from the transistor $Q_{15}$.

The npn transistor $Q_4$ shortens the undershoot recovery interval by providing a high charging current as long as the timing capacitor $C_{T1}$ voltage is below the lower threshold voltage $V_{TL1}$.

During the timing capacitor $C_{T1}$ charging phase, the SCR is cut off. No current flows through the resistor $R_2$. Both of the transistors $Q_{12}$ and $Q_{13}$ are off. The output logic signal $\overline{clk}$ is at a logic high level. Since the output logic signal $\overline{clk}$ is at the same voltage level as the supply voltage $V_{CC}$ during the entire charging phase of the oscillator, the average dc current through the transistor $Q_{13}$ can be kept at a very low level if the discharging time period $T_{D1}$ is designed to be a small fraction of the total time period. The quiescent biasing currents for both comparators can also be kept at a very low level.

Figure 7:
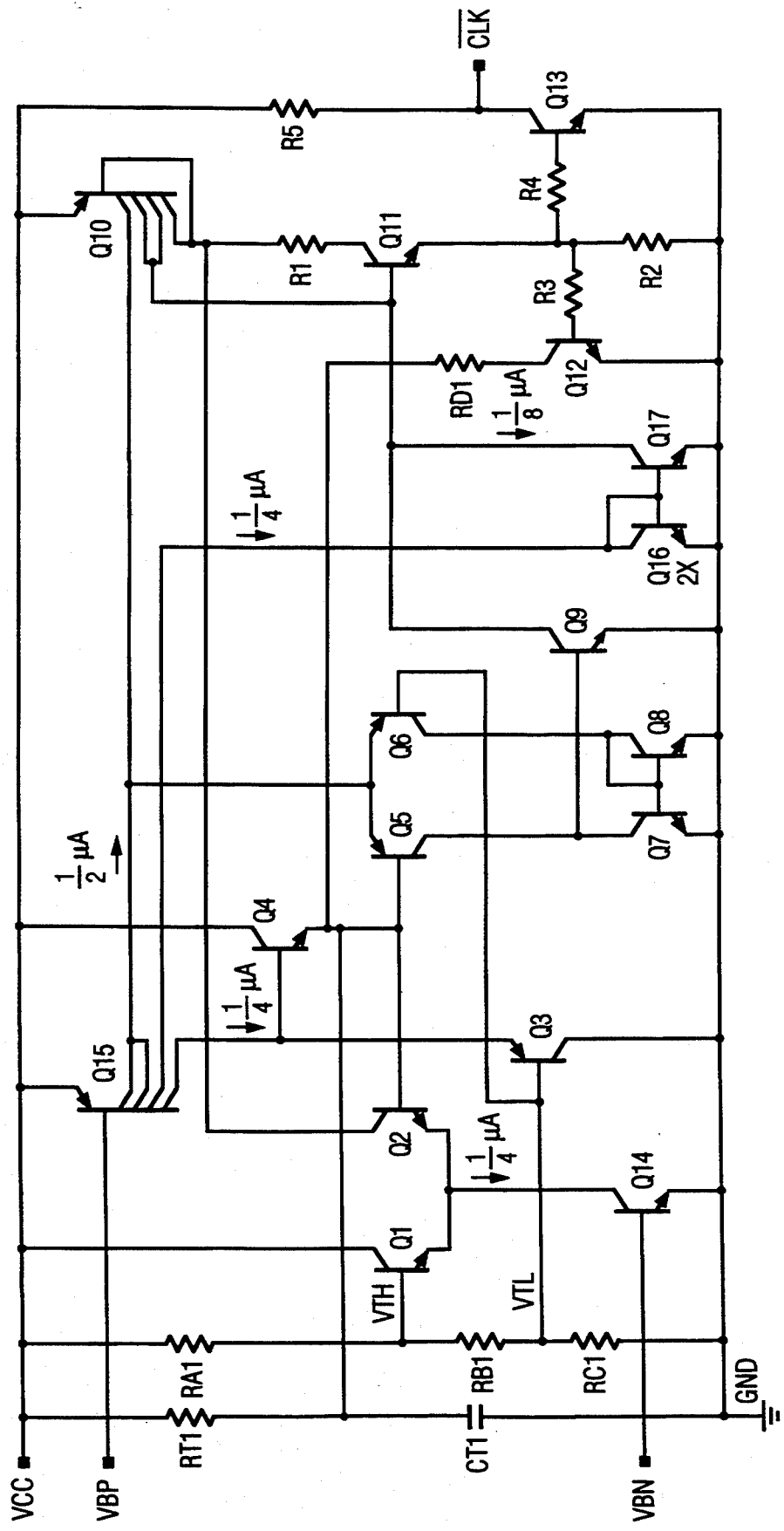
FIG. 7 illustrates another alternate embodiment of the oscillator of the present invention with a current sink coupled to ensure the transistor $Q_{11}$ remains off completely during a charging phase.

If the transistor $Q_{10}$ leaks current, the transistor $Q_{11}$ may not remain off completely during a charging phase. To overcome this deficiency, a bleed resistor can be coupled between the base of the transistor $Q_{11}$ and ground. In the alternative, as shown in FIG. 7 the bleed resistor can be substituted by an npn current source $Q_{17}$ with its base tied to the base and collector of a diode connected npn $Q_{16}$, its emitter tied to ground and its collector tied to the base of the transistor $Q_{11}$. The base and collector of the diode connected npn $Q_{16}$ are coupled to one of the emitters of the transistor $Q_{15}$ and its emitter is coupled to ground. Such a bleed resistor or current source will sink to ground the current leaked by the transistor $Q_{10}$ thereby allowing the transistor $Q_{11}$ to remain fully off during a charging phase.

In this design, the transistor $Q_{14}$ conducts a current of 0.25 μA and each collector of the transistor $Q_{15}$ conducts a current of 0.5 μA. The transistor $Q_2$ starts to conduct as the voltage across the timing capacitor $C_{T1}$ approaches the upper threshold voltage $V_{TH}$. The collector current of the transistor $Q_2$, is drawn into the diode-connected portion of the transistor $Q_{10}$. If each collector of the transistor $Q_{10}$ is sized equally, then a current having twice the value of the current through the transistor $Q_{12}$ will flow into the base of the transistor $Q_{11}$ (note that the transistor $Q_9$ is cut off when the voltage across the capacitor $C_{T1}$ is near the upper threshold voltage $V_{TH1}$). The transistor $Q_{11}$ will then start to conduct and its collector current will have a value equal to the common-emitter current gain $\beta$ multiplied by two times the collector current of the transistor $Q_2$. The collector current of the transistor $Q_{11}$ is doubled (due to the transistor $Q_{10}$) and forced into the base of the transistor $Q_{11}$. The current in the transistor $Q_{11}$ quickly multiplies from the low initial trigger current to a value limited by the resistor $R_1$. Meanwhile, the bias current for the differential pair including the transistors $Q_5$ and $Q_6$ is also increased to the level of the collector current through the transistor $Q_{11}$. The resistor $R_1$ is chosen such that the current-limited SCR current is much higher than the quiescent bias current of the differential pair of the transistors $Q_5$ and $Q_6$. Therefore, the switching speed of the lower threshold voltage $V_{TL1}$ sensing comparator is increased during the discharging phase. The time periods $t_{pd2}$ and $t_{RCV2}$ and the undershoot voltage $V_{US}$ are all reduced as is the frequency sensitivity of the oscillator due to switching delays. Once the SCR turns on, the transistors $Q_{12}$ and $Q_{13}$ conduct. The transistor $Q_{12}$ discharges the capacitor $C_{T1}$ through the resistor $R_{D1}$. The transistor $Q_{13}$ pulls the output logic signal $\overline{clk}$ low. As the voltage across the timing capacitor $C_{T1}$ is discharged to a level below the lower voltage threshold $V_{TL1}$, the transistor $Q_9$ turns on which shunts the base drive of the transistor $Q_{11}$ to the ground and cuts off the SCR. The transistors $Q_{12}$ and $Q_{13}$ also turn off. The output logic signal $\overline{clk}$ rises to a logical high and the discharge phase ends. The resistor $R_{T1}$ now charges the timing capacitor $C_{T1}$ and the cycle repeats itself.

The oscillator will dissipate very little dc power if the discharging time $T_D$ is made much shorter than the charging time $T_C$, i.e. if the resistor $R_{D1}$ is designed to have a much lower resistance value than the resistor $R_{T1}$. The SCR and the transistor $Q_{13}$ conduct significant pulsed current only during the discharge of the voltage across the timing capacitor $C_{T1}$. This current pulse is reduced to a low average value by the duty ratio of the output logic signal $\overline{clk}$.

Figure 2:
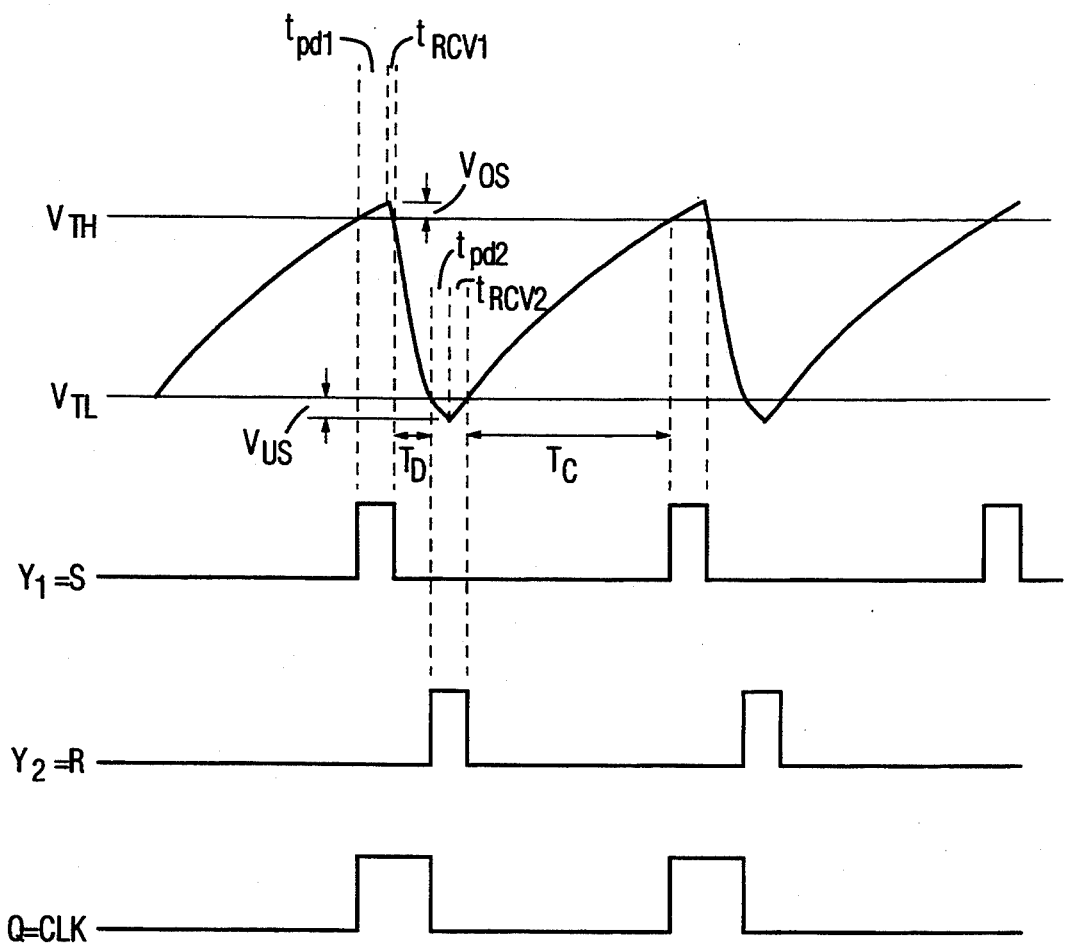
FIG. 2 illustrates a timing diagram of the oscillator of FIG. 1.
Figure 4:
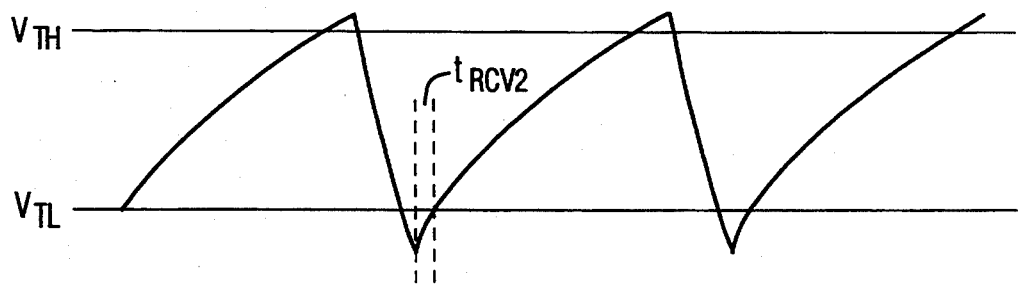
FIG. 4 illustrates the timing diagram of the oscillator of FIG. 3 and its improvement in undershoot recovery.

The transistor $Q_4$ clamps the valley voltage of the timing capacitor $C_{T1}$ ramp and offers further improvement in the undershoot recovery time period $t_{RCV2}$ as illustrated in FIG. 4. In the absence of boosted tail current from the SCR, the comparator consisting of the transistors $Q_5$, $Q_6$, $Q_7$, $Q_8$ and $Q_9$ is slow to respond to the lower threshold voltage $V_{TL1}$ crossover. The transistor $Q_4$ pulls the capacitor $C_{T1}$ up towards the lower voltage threshold $V_{TL1}$. This may result in a very small differential voltage across the transistors $Q_5$ and $Q_6$ and may actually make the switching response worse. Referring to FIG. 2, the rising edge of the logic input $Y_2$ is postponed and the output logic signal $\overline{clk}$ probe width cannot be reduced below a certain minimum value.

The oscillator described exhibits high frequency stability while consuming extremely low power. The transistor $Q_4$ serves to minimize the undershoot recovery and thus the recovery time period $t_{RCV2}$. Instead of the output signal $\overline{clk}$ being driven high during the discharge time period $T_{D1}$ as the output signal of the prior art circuit of FIG. 1, the circuit of the present invention turns on the silicon controlled rectifier and drives the output signal $\overline{clk}$ low only during the short discharge time period $T_{D1}$. The power dissipated in the entire oscillator is kept low because the pulsed current during the discharge of the capacitor $C_T$ averages out to a low average value. The silicon controlled rectifier supplies additional bias current to the lower threshold voltage $V_{TL}$ comparator to speed up the switching time and minimize the recovery time period $t_{RCV2}$.

Figure 5:
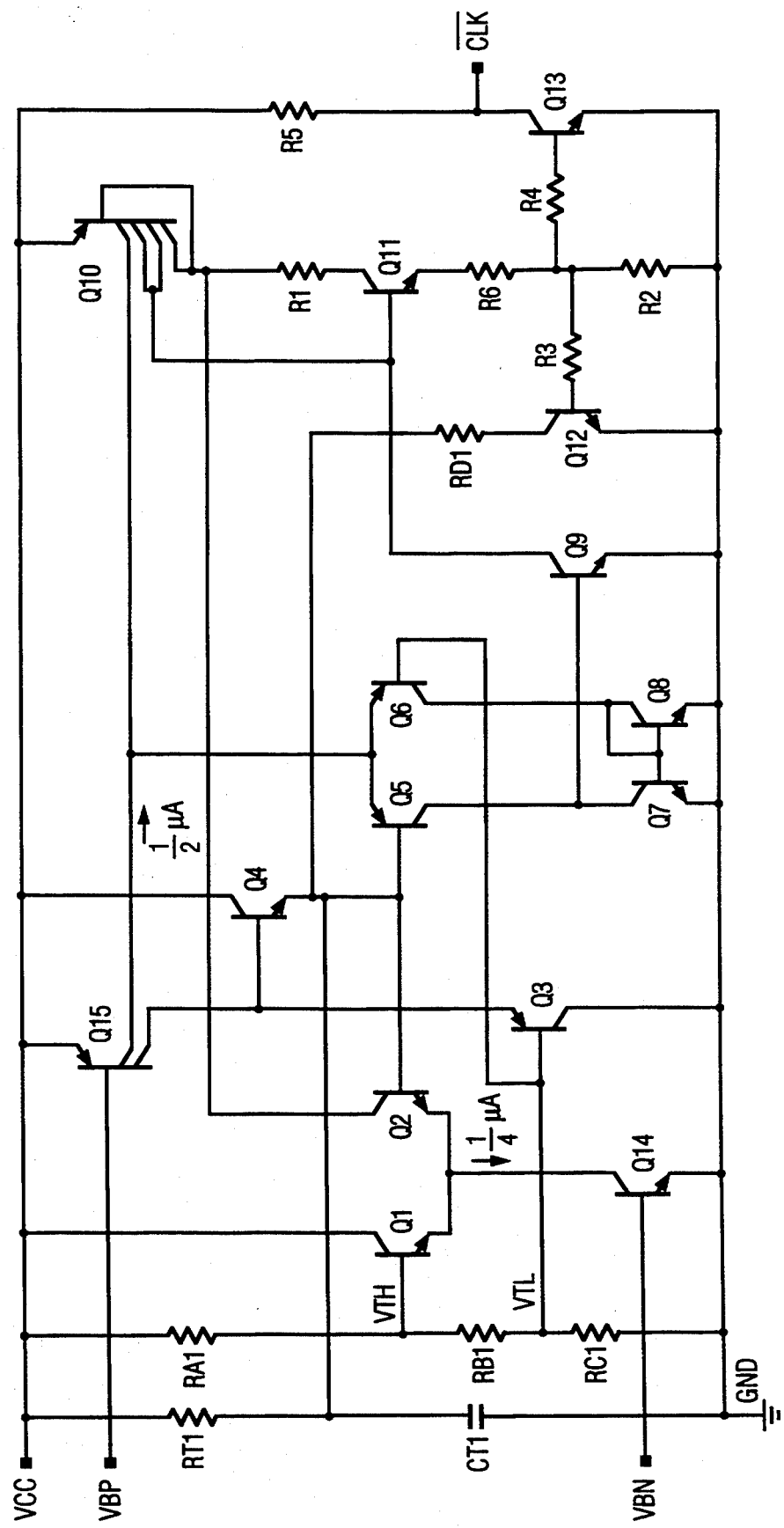
FIG. 5 illustrates an alternate embodiment of the oscillator of the present invention with an additional resistor $R_6$.
Figure 6:
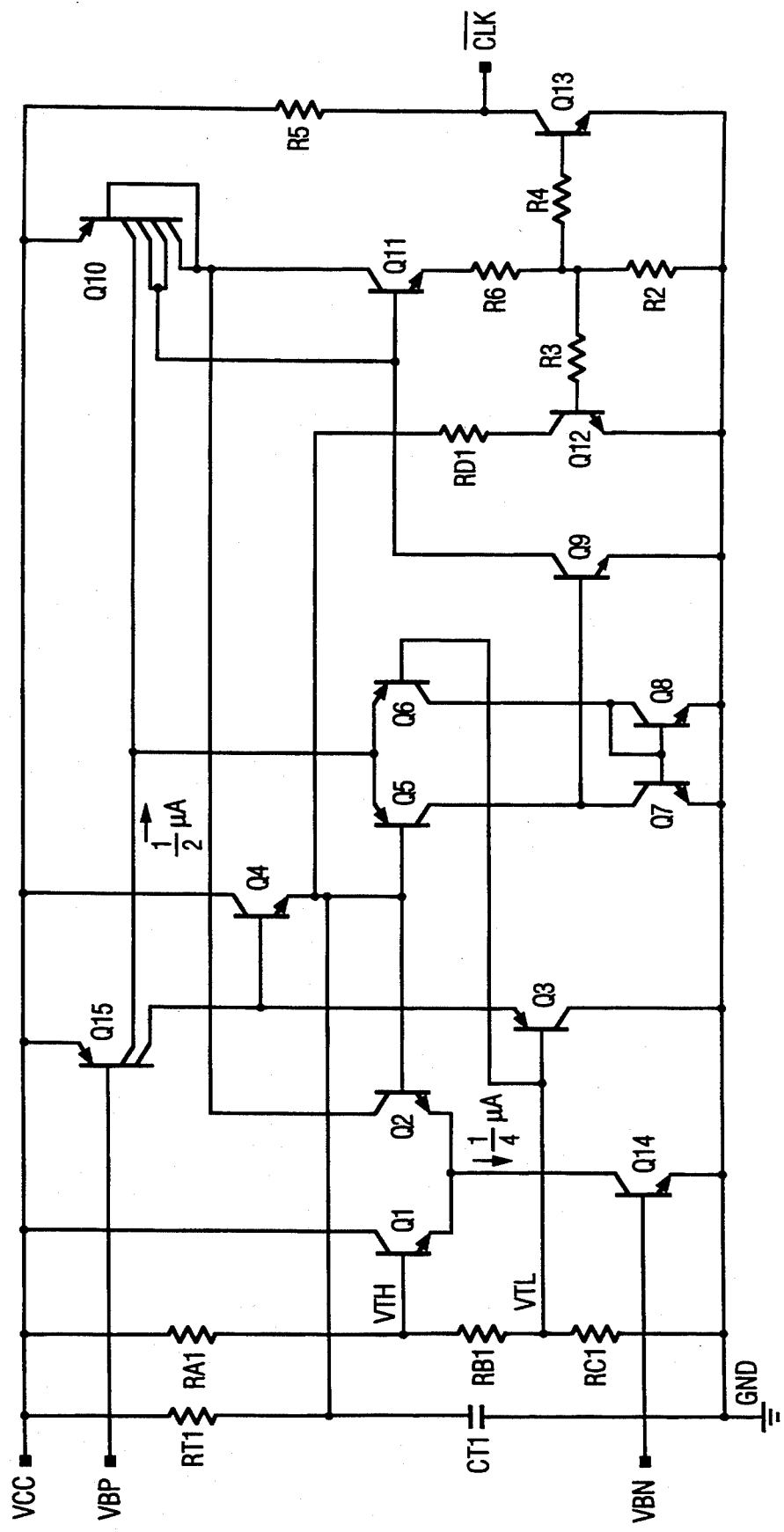
FIG. 6 illustrates an alternate embodiment of the oscillator of the present invention with an additional resistor $R_6$ and without the resistor $R_1$.

The circuit of FIG. 5 illustrates a first alternate embodiment including a resistor $R_6$ in the emitter circuit of the transistor $Q_{11}$ which limits current in the silicon controlled rectifier. The circuit of FIG. 6 illustrates a second alternate embodiment which limits current in the silicon controlled rectifier. The circuit of FIG. 6 includes the resistor $R_6$ in the emitter circuit of the transistor $Q_{11}$ but does not include the resistor $R_1$ in the collector circuit of the transistor $Q_{11}$.

We claim:

1. A micro power oscillator for generating a frequency stable clock signal, comprising:
    a. means for generating an input signal with a predetermined frequency;
    b. first means for comparing the input signal to a high threshold voltage coupled to the means for generating;
    c. a second means for comparing the input signal to a low threshold voltage coupled to the means for generating; and
    d. a silicon controlled rectifier coupled to the first and second means for comparing for forming a logic signal in response to the input signal.

2. The micro power oscillator as claimed in claim 1 wherein the means for generating comprises a timing resistor coupled to a power supply and a timing capacitor coupled between the timing resistor and a ground, wherein the timing resistor charges the timing capacitor for storing a voltage across the timing capacitor.

3. The micro power oscillator as claimed in claim 2 wherein the means for generating further comprises a discharge resistor coupled to the timing capacitor for appropriately discharging the voltage stored across the timing capacitor.

4. The micro power oscillator as claimed in claim 3 wherein the high threshold voltage and the low threshold voltage are set by a voltage divider network comprising a first resistor, a second resistor and a third resistor serially coupled between the power supply and the ground.

5. The micro power oscillator as claimed in claim 4 further comprising a voltage clamping transistor coupled to the first means for comparing and the second means for comparing.

6. The micro power oscillator as claimed in claim 5 wherein the first means for comparing comprises a first differential pair of npn transistors coupled together to form a comparator.

7. The micro power oscillator as claimed in claim 6 wherein the low threshold voltage comparator comprises a second differential pair of pnp transistors coupled together to form a comparator.

8. The micro power oscillator as claimed in claim 7 wherein the silicon controlled rectifier comprises a first npn transistor appropriately coupled to a second transistor and a fourth resistor coupled between the first and the second transistors.

9. The micro power oscillator as claimed in claim 8 wherein the silicon controlled rectifier further comprises a fifth resistor coupled to the second transistor.

10. A micro power oscillator for generating a frequency stable clock signal, comprising:
    a. a timing capacitor;
    b. means for charging and discharging the timing capacitor coupled to the timing capacitor;
    c. a high threshold voltage comparator for comparing the voltage across the timing capacitor to a predetermined high threshold voltage, the high threshold voltage comparator coupled to the timing capacitor;
    d. a low threshold voltage comparator for comparing the voltage across the timing capacitor to a predetermined low threshold voltage, the low threshold voltage comparator coupled to the timing capacitor; and
    e. a silicon controlled rectifier coupled to the high threshold voltage comparator and the low threshold voltage comparator for outputting a logic signal in response to the voltage across the timing capacitor.

11. The micro power oscillator as claimed in claim 10 wherein the means for charging and discharging the timing capacitor comprises a timing resistor coupled between the timing capacitor and a power supply for charging the timing capacitor and a discharge resistor coupled between the timing capacitor and ground for appropriately discharging the capacitor.

12. The micro power oscillator as claimed in claim 11 wherein the high threshold voltage and the low threshold voltage are set by a voltage divider network comprising a first resistor, a second resistor and a third resistor coupled between the power supply and the ground.

13. The micro power oscillator as claimed in claim 12 further comprising a voltage clamping transistor coupled to the low threshold voltage comparator and to the high threshold voltage comparator.

14. The micro power oscillator as claimed in claim 13 wherein the high threshold voltage comparator comprises a first differential pair of npn transistors coupled together to form a comparator.

15. The micro power oscillator as claimed in claim 14 wherein the low threshold voltage comparator comprises a second differential pair of pnp transistors coupled together to form a comparator.

16. The micro power oscillator as claimed in claim 15 wherein the silicon controlled rectifier comprises a first npn transistor appropriately coupled to a second transistor and a fourth resistor coupled therebetween.

17. The micro power oscillator as claimed in claim 16 wherein the silicon controlled rectifier further comprises a fifth resistor coupled to the second transistor.

18. A micro power oscillator for generating a frequency stable clock signal, comprising:
  a. a timing resistor having a first terminal and a second terminal, the first terminal of the timing resistor coupled to a power supply;
  b. a timing capacitor having a first terminal and a second terminal, the first terminal of the timing capacitor coupled to the second terminal of the timing resistor and the second terminal of the timing capacitor coupled to a ground;
  a voltage divider network including a first resistor, a second resistor and a third resistor each having a first terminal and a second terminal, the first terminal of the first resistor coupled to the power supply, the second terminal of the first resistor coupled to the first terminal of the second resistor forming a high threshold voltage node, the second terminal of the second resistor coupled to the first terminal of the third resistor forming a low threshold voltage node and the second terminal of the third resistor coupled to the ground;
  d. a first differential pair including a first and a second transistor each having a base, a collector and an emitter, the base of the first transistor coupled to the second terminal of the first resistor and the first terminal of the second resistor, the collector of the first transistor coupled to the power supply, the emitter of the first transistor coupled to the emitter of the second transistor;
  a third transistor having a base, a collector, and an emitter, the base of the third transistor coupled to the second terminal of the second resistor and the first terminal of the third resistor and the collector of the third transistor coupled to the ground;
  f. a fourth transistor having a base, a collector, and an emitter, the base of the fourth transistor coupled to the emitter of the third transistor, the collector of the fourth transistor coupled to the power supply and the emitter of the fourth transistor coupled to the second terminal of the timing resistor, the first terminal of the timing capacitor and the base of the second transistor;
  g. a second differential pair including a fifth transistor and a sixth transistor, each having a base, a collector and an emitter, the base of the fifth transistor coupled to the base of the second transistor, the emitter of the fourth transistor, the second terminal of the timing resistor and the first terminal of the timing capacitor, the emitter of the fifth transistor coupled to the emitter of the sixth transistor and the base of the sixth transistor coupled to the base of the third transistor and the second terminal of the second resistor and first terminal of the third resistor;
  h. a discharge resistor having a first terminal and a second terminal, the first terminal of the discharge resistor coupled to the emitter of the fourth transistor, the base of the second transistor, the base of the fifth transistor, the second terminal of the timing resistor and the first terminal of the timing capacitor;
  i. a seventh transistor having a base, a collector and an emitter, the collector of the seventh transistor coupled to the collector of the fifth transistor and the emitter of the seventh transistor coupled to the ground;
  j. an eighth transistor having a base, a collector and an emitter, the base of the eighth transistor coupled to the base of the seventh transistor, the collector of the eighth transistor and the collector of the sixth transistor and the emitter of the eighth transistor coupled to the ground;
  k. a ninth transistor having a base, a collector and an emitter, the base of the ninth transistor coupled to the collector of the fifth transistor and the collector of the seventh transistor and the emitter of the ninth transistor coupled to the ground;
  l. a tenth transistor having a base, a first collector, a second collector, a third collector, a fourth collector and an emitter, the emitter of the tenth transistor coupled to the power supply, the base of the tenth transistor coupled to the fourth collector of the tenth transistor and the collector of the second transistor, the first collector of the tenth transistor coupled to the emitter of the fifth transistor and the emitter of the sixth transistor, and the second collector of the tenth transistor coupled to the third collector of the tenth transistor and the collector of the ninth transistor;
  m. a fourth resistor having a first terminal and a second terminal, the first terminal of the fourth resistor coupled to the fourth collector of the tenth transistor, the base of the tenth transistor and the collector of the second transistor;
  n. an eleventh transistor having a base, a collector and an emitter, the base of the eleventh transistor coupled to the second and third collectors of the tenth transistor and the collector of the eleventh transistor coupled to the second terminal of the fourth resistor;
  o. a fifth, sixth and seventh resistor, each having a first and a second terminal, the second terminal of the fifth resistor coupled to the first terminal of the sixth resistor, the first terminal of the seventh resistor and the emitter of the eleventh transistor and the second terminal of the sixth resistor coupled to the ground;
  p. a twelfth transistor having a base, a collector and an emitter, the base of the twelfth transistor coupled to the first terminal of the fifth resistor, the collector of the twelfth transistor coupled to the second terminal of the discharge resistor and the emitter of the twelfth transistor coupled to the ground;

q. a thirteenth transistor having a base, a collector and an emitter, the base of the thirteenth transistor coupled to the second terminal of the seventh resistor and the emitter of the thirteenth transistor coupled to the ground;

r. an eighth resistor having a first and a second terminal, the first terminal of the eighth resistor coupled to the power supply and the second terminal of the eighth resistor coupled to the collector of the thirteenth transistor forming an output logic signal node;

s. a fourteenth transistor having a base, a collector and an emitter, the base of the fourteenth transistor coupled to a first biasing voltage, the collector of the fourteenth transistor coupled to the emitter of the first transistor and the emitter of the second transistor and the emitter of the fourteenth transistor coupled to the ground; and t. a fifteenth transistor having a base, a first collector, a second collector and an emitter, the base of the fifteenth transistor coupled to a second biasing voltage, the emitter of the fifteenth transistor coupled to the power supply, the first collector of the fifteenth transistor coupled to the first collector of the tenth transistor, the emitter of the fifth transistor and the emitter of the sixth transistor and the second collector of the fifteenth transistor coupled to the base of the fourth transistor and the emitter of the third transistor.

* * * * *